United States Patent [19]

Summerfelt et al.

[11] Patent Number: 5,612,574
[45] Date of Patent: Mar. 18, 1997

[54] SEMICONDUCTOR STRUCTURES USING HIGH-DIELECTRIC-CONSTANT MATERIALS AND AN ADHESION LAYER

[75] Inventors: Scott R. Summerfelt, Dallas; Howard R. Beratan, Richardson, both of Tex.

[73] Assignee: Texas Instruments Incorporated, Dallas, Tex.

[21] Appl. No.: 476,948

[22] Filed: Jun. 6, 1995

[51] Int. Cl.[6] ............ H01L 29/12; H01L 29/92; H01L 29/68; H01G 4/10
[52] U.S. Cl. ............ 257/783; 257/295; 257/700; 257/774
[58] Field of Search ............ 257/774, 37, 773, 257/700, 292, 783, 295, 310

[56] References Cited

U.S. PATENT DOCUMENTS 5,187,638  2/1993  Sandhu et al. ............ 257/295
5,382,817  1/1995  Kashihara et al. ............ 257/295
5,418,388  5/1995  Okudaira et al. ............ 257/295

OTHER PUBLICATIONS

Eimori et al. "A Newly Designed Planar Stacked Capacitor Cell with High dielectric Constant Film for 256mbit DRAM," IEEE, Dec. 5–8, 1993.

*Primary Examiner*—Sara W. Crane
*Assistant Examiner*—Alexander Oscar Williams
*Attorney, Agent, or Firm*—James E. Harris; James C. Kesterson; Richard L. Donaldson

[57] ABSTRACT

A semiconductor device (10) is illustrated, which is formed on an active region (14) of a semiconductor substrate (12). Device (10) comprises a conductive plug (20) and a barrier layer (22) formed in an opening in an interlevel isolation layer (18). An inner electrode (24) is caused to adhere to the interlevel isolation layer (18) through the use of an adhesion layer (26). High-dielectric-constant layer (28) and an outer electrode (30) are formed outwardly from inner electrode (24).

20 Claims, 1 Drawing Sheet

SEMICONDUCTOR STRUCTURES USING HIGH-DIELECTRIC-CONSTANT MATERIALS AND AN ADHESION LAYER

RELATED APPLICATIONS

This application is related to U.S. patent application Ser. No. 08/481,661, filed Jun. 6, 1995 entitled "Method of Forming Inner Electrodes in High Density, High-Dielectric-Constant Memory Devices," and U.S. patent application Ser. No. 08/476,950, filed Jun. 6, 1995 entitled "Processing Methods for High-Dielectric-Constant Materials".

The following previously-filed applications are related to the instant application:

U.S. patent application Ser. No. 08/283,881 entitled "Improved High-Dielectric-Constant Material Electrodes Comprising Thin Platinum Layers" invented by Summerfelt, Beratan, Kirlin, and Gnade;

U.S. patent application Ser. No. 08/283,468 entitled "Improved Electrodes Comprising Conductive Perovskite-Seed Layers for Perovskite Dielectrics" invented by Summerfelt and Beratan;

U.S. patent application Ser. No. 08/283,442 entitled "Improved High-Dielectric-Constant Material Electrodes Comprising Thin Ruthenium Dioxide Layers" invented by Summerfelt, Beratan, Kirlin and Gnade;

U.S. patent application Ser. No. 08/283,467 entitled "Pre-Oxidizing High-Dielectric-Constant Material Electrodes" invented by Nishioka, Summerfelt, Park and Bhattacharya U.S. patent application Ser. No. 08/283,871 entitled "High-Dielectric-Constant Material Electrodes Comprising Sidewall Spacers" invented by Nishioka, Park, Bhattacharya and Summerfelt;

U.S. patent application Ser. No. 08/283,441 entitled "A Conductive Amorphous-Nitride Barrier Layer for High-Dielectric-Constant Material Electrodes" invented by Summerfelt;

U.S. patent application Ser. No. 08/283,873 entitled "A Conductive Exotic-Nitride Barrier Layer for High-Dielectric-Constant Material Electrodes" invented by Summerfelt;

U.S. patent application Ser. No. 08/276,191, filed Jul. 15, 1994, entitled "Lightly Donor-Doped Electrodes for High-Dielectric-Constant Materials" invented by Summerfelt, Beratan and Gnade;

U.S. patent application Ser. No. 08/009,521 entitled "Improved Electrical Connections to Dielectric Materials" invented by Gnade and Summerfelt;

U.S. patent application Ser. No. 08/260,149 entitled "Lightly Donor-Doped Electrodes for High-Dielectric-Constant Materials" invented by Summerfelt, Beratan and Gnade;

U.S. patent application Ser. No. 08/040,946 entitled "Lightly Donor-Doped Electrodes for High-Dielectric-Constant Materials" invented by Summerfelt, Beratan and Gnade; and U.S. patent application Ser. No. 08/041,025 entitled "Improved Electrode Interface for High-Dielectric-Constant Materials" invented by Summerfelt and Beratan.

TECHNICAL FIELD OF THE INVENTION

This invention relates in general to the field of electronic devices, and more particularly to improved semiconductor devices using high-dielectric-constant materials and adhesion layers.

BACKGROUND OF THE INVENTION

The density of devices in a dynamic random access memory array depends on the ability to store electronic charge in as little a space as possible. The need for higher density systems has resulted in the use of high-dielectric-constant materials in the capacitors within such memory cell arrays. The ability to store charge within a memory cell is related to the capacitance of the capacitor used in the memory cell. Capacitance is related to the surface area of the electrodes in contact with the capacitor dielectric and the permittivity of the dielectric material. Exotic high-dielectric-constant materials such as barium strontium titanate (Ba, Sr)TiO$_3$ (sometimes abbreviated BST) provide for extremely high permittivities, but create problems in the architecture of microelectronic devices because the high-dielectric-constant materials must be deposited in an oxygen ambient. For this reason, electrodes disposed adjacent the high-dielectric-constant materials are constructed of oxygen-stable materials, such as ruthenium oxide or noble metals like platinum. The use of these electrode materials creates further problems because they do not adhere well to dielectrics that have been exposed to air. Typically, the base electrode of the capacitor is formed on an outer surface of an interlevel dielectric layer. If the oxygen-stable electrode does not adhere to the interlevel dielectric, the oxygen-stable layer can peel from the dielectric layer, seriously degrading or destroying the device.

Accordingly, a need has arisen for a device architecture which eliminates the problems of adhesion between the oxygen-stable layer and the interlayer isolation layer in devices including such materials.

SUMMARY OF THE INVENTION

In accordance with the teachings of the present invention, an electronic device is provided that substantially eliminates or reduces problems associated with prior art device architectures.

According to one embodiment of the present invention, an electronic device is provided that comprises an active region formed in a silicon substrate. A conductive plug is disposed outwardly from the active region and in contact with portions of the active region. An interlevel isolation layer covers the remainder of the active region. A barrier layer is disposed outwardly from the conductive plug. An oxygen-stable inner electrode is formed outwardly from portions of the interlevel isolation layer and the barrier layer. An adhesion layer is disposed between the oxygen-stable inner electrode and the interlevel isolation layer and the barrier layer. A high-dielectric-constant layer is disposed outwardly from the oxygen-stable inner electrode. An outer electrode is disposed outwardly from the high-dielectric-constant layer.

BRIEF DESCRIPTION OF THE DRAWINGS

A more complete understanding of the advantages of the present invention may be acquired by referring to the attached figures in which like reference numbers indicate like features and wherein.

DETAILED DESCRIPTION OF THE INVENTION

Figure 1:
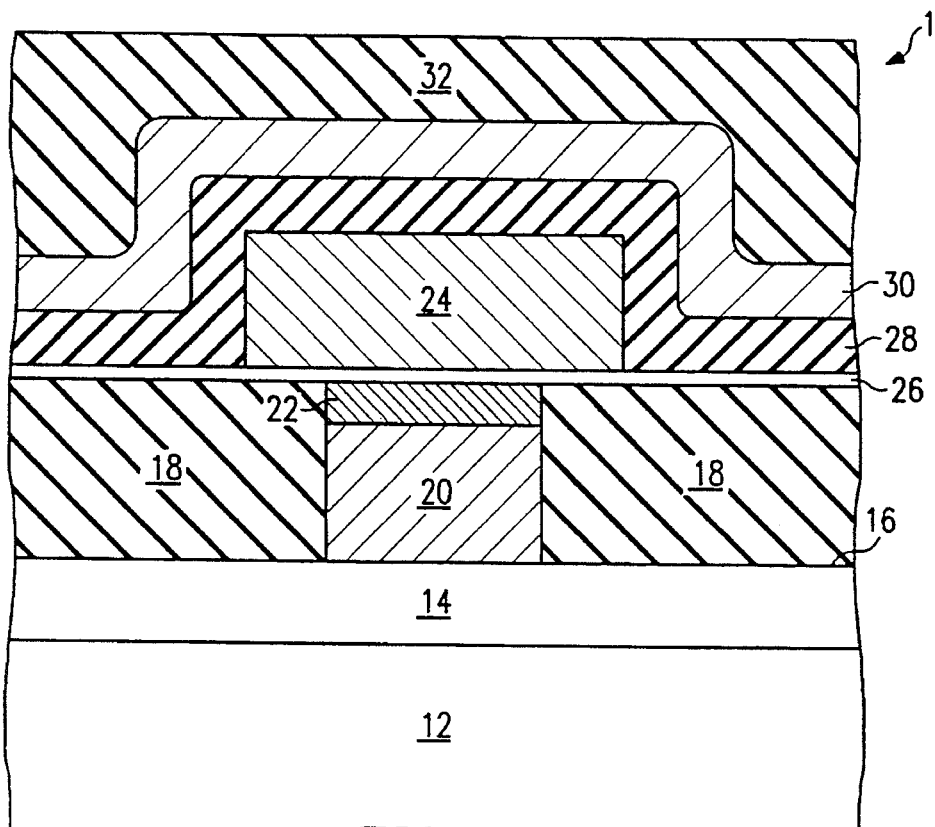
FIG. 1 is a cross-sectional elevational diagram of a first embodiment of an electronic device constructed according to the teachings of the present invention.

Referring to FIG. 1, an electronic device, indicated generally at 10, is shown constructed on a semiconductor substrate 12. Semiconductor substrate 12 comprises a suitable semiconductor material such as silicon. Semiconductor substrate 12 may also comprise other single-component semiconductors such as germanium or diamond. In addition, substrate 12 may comprise compound semiconductors such as gallium arsenide, gallium nitride, indium phosphide, silicon germanium, or silicon carbide.

Substrate 12 comprises an active region 14 which is formed proximate an outer surface 16 of substrate 12. Active region 14 comprises diffused and non-diffused regions of active semiconductor devices formed in substrate 12. For example, active region 14 can contain conductive interconnects, resistors and transistors. The majority of the outer surface 16 is covered by an interlevel isolation layer 18 which may comprise, for example, silicon dioxide, boron phosphate silicate glass, or spin-on glass. Interlevel isolation layer 18 may also comprise multiple layers including diffusion barriers that may comprise, for example, silicon nitride. Diffusion barriers are especially useful when layers formed outwardly from interlevel isolation layer 18 comprise compounds which could migrate through interlevel isolation layer 18 and diffuse into active region 14. For example, if outer layers include lead compounds, diffusion barriers within interlevel isolation layer 18 can prevent such lead compounds from diffusing into active region 14.

During the construction of device 10, an opening is formed through interlevel isolation layer 18 to expose a portion of outer surface 16 of active region 14. A conductive plug 20 is then formed within the opening in contact with outer surface 16. Conductive plug 20 comprises an oxidizable material such as poly-crystalline silicon which has been doped to be rendered conductive. Conductive plug 20 may also comprise titanium nitride, titanium silicide, or other reactive metal compounds such as zirconium nitride, tantalum silicide, tungsten silicide, molybdenum silicide, nickel silicide, tantalum carbide, or titanium boride. In addition, conductive plug 20 may comprise other single-component semiconductors which have been doped to be rendered conductive, such as single- or poly-crystalline silicon or germanium. In addition, conductive plug 20 may comprise reactive metals such as aluminum, tungsten, tantalum, titanium, or molybdenum. Conductive plug 20 may also comprise conductive carbides or borides such as boron carbide. Conductive plug 20 may also comprise doped compound semiconductors such gallium arsenide, indium phosphide, combinations of silicon and germanium, and silicon carbide. Conductive plug 20 may also comprise a variety of combinations of the above-referenced materials.

A barrier layer 22 is also formed in the opening through interlevel isolation layer 18 in conductive contact with conductive plug 20. Barrier layer 22 operates to isolate the conductive plug 20 from the material within an inner electrode 24 formed outwardly from and completing covering barrier layer 22 and formed outwardly from portions of interlevel isolation layer 18, as shown in FIG. 1.

Barrier layer 22 may comprise, for example, titanium nitride. In addition, barrier layer 22 may comprise ternary or greater amorphous nitrides, such as Ta-Si-N, Ta-B-N, or Ti-B-N. Barrier layer 22 may also comprise a variety of exotic conductive nitrides such as Zr nitride, Hf nitride, Y nitride, Sc nitride, La nitride, and other rare earth nitrides such as N deficient Al nitride, doped Al nitride, Ti-Al nitride, Mg nitride, Ca nitride, Sr nitride, and Ba nitride. In addition, barrier layer 22 may comprise alloys of the above exotic conductive nitrides with common silicon processing materials, such as titanium nitride, gallium nitride, Ni nitride, Co nitride, Ta nitride, and W nitride. In addition, barrier layer 22 may comprise a variety of noble metal insulator alloys such as Pt-Si-N, Pd-Si-O, Pd-B-(O,N), Pd-Al-N, Ru-Si-(O,N), Ir-Si-O, Re-Si-N, Rh-Al-O, Au-Si-N, or Ag-Si-N. In addition, barrier layer 22 may comprise heterogenous structures comprising multiple layers and combinations of the above-referenced materials.

Inner electrode 24 comprises an oxygen-stable material such as platinum or ruthenium oxide. In addition, inner electrode 24 may comprise other noble or platinum group metals or alloys thereof such as palladium, iridium, rhenium, rhodium, gold, or silver. In addition, inner electrode 24 may comprise conductive metal compounds such as ruthenium oxide, tin oxide, indium oxide, rhenium oxide, osmium oxide, rhodium oxide, iridium oxide, or doped tin, indium or zinc oxide. In addition, inner electrode 24 may comprise conductive perovskite-like materials such as $YBa_2Cu_3O_{7-x}$, $(La,Sr)CoO_3$, or $SrRuO_3$. In addition, inner electrode 24 may comprise heterostructures comprising combinations of the above materials.

Prior to the deposition of the layer used to form inner electrode 24, an adhesion layer 26 is deposited everywhere that the layer used to form inner electrode 24 is deposited. Adhesion layer 26 may comprise an extremely thin layer of titanium, tantalum, ruthenium or other suitable material. Adhesion layer 26 is anywhere from 2 to 100 Å in thickness and is preferably on the order of 5 to 10 Å in thickness. This adhesion layer may be deposited by sputtering, chemical vapor deposition, electron beam deposition or thermal evaporation. The wafer may be transported in vacuum prior to deposition of the oxygen stable layer. A vacuum cluster tool would be used where one tool could deposit thin adhesion layer while the second could deposit oxygen stable layer. According to one embodiment, the surface is precleaned in a $H_2+Ar$ plasma immediately followed by sputter deposition of 5° A. of Ti at 100° C. in a cluster tool and then immediately transferred from Ti deposition took to an oxygen stable (Pt for example) deposition tool. The materials used to form inner electrode 24 do not adhere well to dielectric materials that have been exposed to air. As such, the adhesion layer 26 is deposited in order to create an in situ metal or dielectric layer on which the inner electrode 24 may adhere. The adhesion layer 26 is not exposed to an air ambient after deposition and prior to the deposition of the layer used to form inner electrode 24. The material used to form inner electrode 24 will adhere much better to the titanium or tantalum within adhesion layer 26 than would be the case if the inner electrode 24 was placed in direct contact with interlevel isolation layer 18. The adhesion layer 26 also is disposed between the barrier layer 22 and the inner electrode 24. During the operation of the device, charge carriers must pass between inner electrode 24 and barrier layer 22 through the adhesion layer 26. Even though the adhesion layer 26 may become a dielectric during processing, it will not appreciably affect the conductivity of device 10 because it might only partially oxidize and remain conductive after oxidation, or be so thin and discontinuous that it doesn't degrade contact resistance.

Although the adhesion layer 26 has been shown in conjunction with an actual semiconductor device 10, it should be understood that the adhesion layer 26 also functions to prevent the peeling of sacrificial portions of the inner electrode material prior to further processing. For example, if inner electrode 24 were constructed of platinum, large areas of platinum that would later be removed still must adhere to the interlayer isolation layer 18 prior to further processing. If the large layers of sacrificial platinum peel off of the interlevel isolation layer 18 during processing before they are removed by choice, the loose pieces of sacrificial platinum can destroy the device and greatly interfere with ongoing processing of the integrated electronic system.

In the device 10 shown in FIG. 1, if the inner electrode 24 peels away from interlevel isolation layer 18, it is extremely difficult to effectively form any more layers outwardly from inner electrode 24. In addition, if inner electrode layer 24 peels away too much from interlevel isolation layer 18, the barrier layer 22 may be exposed to oxygen during the processing of layers formed outwardly from inner electrode 24.

Device 10 is completed by depositing a high-dielectric-constant layer 28 and a top electrode layer 30 outwardly from inner electrode layer 24. An outer isolation layer 32 is deposited to isolate device 10 from ambient conditions or other structures built outwardly from device 10. High-dielectric-constant layer 28 may comprise, for example, barium strontium titanate or other perovskite, pyroelectric, ferroelectric, or other high-dielectric-constant oxides such as $(Ba,Sr,Ca,Pb)(Ti,Zr)O_3$, $(Pb,La)(Zr,Ti)O_3$, bismuth titanate, potassium tantalate, lead scandium tantalate, lead niobate, potassium niobate, lead zinc niobate, lead magnesium niobate, tantalum pentoxide, layered perovskites such as $SrBi_2Ta_2O_5$ or yttrium oxide. High-dielectric-constant layer 28 may also comprise combinations of the above-referenced materials or multiple layers of the above-referenced materials.

Outer electrode 30 may comprise platinum or other noble or platinum group metal such as palladium, ruthenium, rhodium, gold, iridium, or silver. In addition, outer electrode 30 may comprise conductive metal compounds such as titanium nitride, ruthenium nitride, tin nitride, zirconium nitride, tungsten nitride, ruthenium dioxide, tin oxide, zinc oxide, doped zinc oxide, iridium oxide, titanium silicide, tantalum silicide, tungsten silicide, molybdenum silicide, nickel silicide, tantalum carbide, or titanium boride. In addition, outer electrode 30 may comprise a reactive metal such as tantalum, titanium, molybdenum, or tungsten. In addition, outer electrode 30 may comprise typical conductive materials used in semiconductor processing and metalization such as aluminum, doped silicon, or germanium. Outer electrode 30 may comprise combinations of the above-referenced materials or multiple layers of the above-referenced materials.

Outer isolation layer 32 may comprise silicon dioxide or other suitable insulated materials such as silicon nitride, boron phosphate silicate glass, or spin-on glass.

Device 10 provides for the use of high-dielectric-constant materials in layer 28 and prevents the materials within barrier layer 22 from being exposed to oxygen during the deposition of the high-dielectric-constant materials in layer 28. In addition, barrier layer 22 prevents the contact of the materials within inner electrode 24 which may comprise, for example, platinum, from contacting the materials within conductive plug 20, which may comprise, for example, conductive poly-crystalline silicon. The fact that these materials must be used in this order to prevent various materials from contacting one another creates the problem of the oxygen-stable material within inner electrode 24 being in contact with interlevel isolation layer 18. The adherence of these two materials is solved by the use of the adhesion layer 26 described previously.

Figure 2:
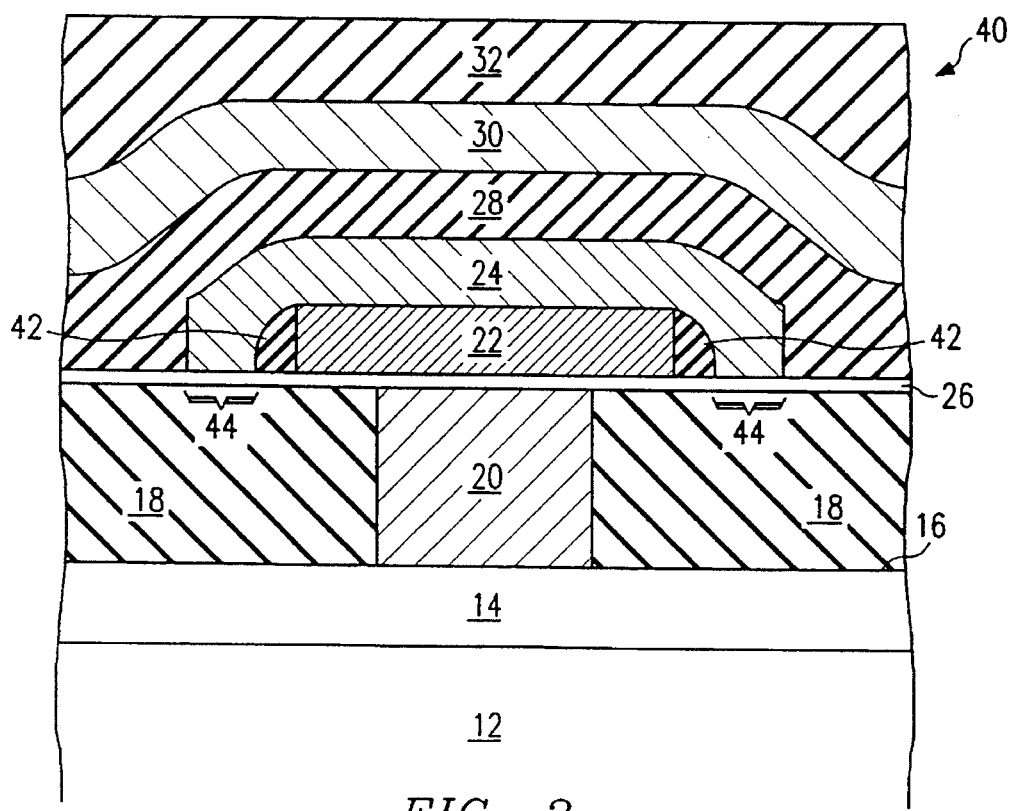
FIG. 2 is a cross-sectional elevational diagram of a second embodiment of an electronic device constructed according to the teachings of the present invention.

FIG. 2 illustrates an alternate embodiment of an electronic device constructed according to the teachings of the present invention. Referring to FIG. 2, a device 40 is shown. As will be discussed herein, device 40 comprises most of the same layers and structures used to construct device 10 discussed previously. As such, the same reference numbers will be used to describe the same portions. Device 40 is constructed on a substrate 12 that comprises an active region 14. Similarly, an interlevel isolation layer 18 is disposed outwardly from an outer surface 16 of active region 14. A conductive plug 20 is formed in an opening through interlevel isolation layer 18. In contrast to device 10, conductive plug 20 passes all the way through interlevel isolation layer 18, and barrier layer 22 is formed outwardly from interlevel isolation layer 18. Adhesion layer 26 is formed between conductive plug 20 and barrier layer 22. Barrier layer 22 completely covers the outer surface of conductive plug 20. In addition, a sidewall isolation ring 42 is formed surrounding the edges of barrier layer 22 outwardly from adhesion layer 26. Sidewall isolation ring 42 may comprise suitable insulative material such as silicon dioxide or silicon nitride, which is deposited as a layer covering barrier layer 22 and then is anisotropically etched to form sidewall isolation ring 42. Inner electrode 24 is formed outwardly from the combination of barrier layer 22 and sidewall isolation ring 42. Adhesion layer 26 acts to improve the adhesion between interlevel isolation layer 18 and inner electrode 24 in region 44, indicated in FIG. 2. Device 40 is completed by the formation of high-dielectric-constant layer 28, outer electrode 30, and outer isolation layer 32, as discussed previously. These same materials discussed with reference to FIG. 1 can be used to construct the corresponding components within device 40, shown in FIG. 2.

Although the present invention has been described in detail, it should be understood that various changes, alterations, and substitutions may be made to the teachings contained herein without departing from the spirit and scope of the present invention, which is solely defined by the appended claims.

What is claimed is:

1. A semiconductor device formed outwardly from an outer surface of a semiconductor substrate, comprising:

an active region disposed proximate the outer surface of the substrate;

a conductive plug electrically connected to the active region;

an interlevel isolation layer disposed adjacent the outer surface of the semiconductor substrate and surrounding the conductive plug;

an inner electrode electrically coupled to the conductive plug and disposed proximate portions of an outer surface of the interlevel isolation layer; and an adhesion layer overlying the conductive plug and disposed between the interlevel isolation layer and the inner electrode, the adhesion layer comprising at least partially oxidized titanium and having a thickness in the range of 2 to 100 angstroms, the adhesion layer operating to cause adhesion between the material comprising the interlevel isolation layer and the material comprising the inner electrode.

2. The device of claim 1, wherein the interlevel isolation layer comprises a material selected from the group consisting of silicon dioxide, silicon nitride, boron phosphate silicate glass, and spin-on glass.

3. The device of claim 1, wherein the inner electrode comprises a material selected from the group consisting of platinum, ruthenium oxide, palladium, iridium, rhenium, rhodium, gold, silver, ruthenium oxide, tin oxide, indium oxide, rhenium oxide, osmium oxide, rhodium oxide, iridium oxide, doped tin oxide, indium oxide, zinc oxide, $YBa_2Cu_3O_{7-x}$, $(La,Sr)CoO_3$, and $SrRuO_3$.

4. The device of claim 1, and further comprising:

a barrier layer disposed between the conductive plug and the adhesion layer, the barrier layer operating to separate the material comprising the inner electrode from the material comprising the conductive plug.

5. The device of claim 4, wherein the broiler layer comprises a material selected from the group of materials consisting of titanium nitride, Ta-Si-N, Ta-B-N, Ti-B-N, Zr nitride, Hf nitride, Y nitride, Sc nitride, La nitride, N deficient Al nitride, doped Al nitride, Mg nitride, Ca nitride, Sr nitride, Ba nitride, titanium nitride, gallium nitride, Ni nitride, Co nitride, Ta nitride, W nitride, Pt-Si-N, Pd-Si-O, Pd-B-(O,N), Pd-Al-N, Ru-Si-(O,N), Ir-Si-O, Re-Si-N, Rh-Al-O, Au-Si-N, and Ag-Si-N.

6. The device of claim 1, wherein the conductive plug comprises a material selected from the group of materials consisting of poly-crystalline silicon which has been doped to be rendered conductive, titanium nitride, titanium silicide, zirconium nitride, tantalum silicide, tungsten silicide, molybdenum silicide, nickel silicide, tantalum carbide, titanium boride, single-crystal silicon doped to be rendered conductive, germanium doped to be rendered conductive, tungsten, tantalum, titanium, aluminum molybdenum, boron carbide, gallium arsenide, and indium phosphide.

7. The device of claim 1, and further comprising:

a high-dielectric-constant layer disposed outwardly from the inner electrode;

an outer electrode disposed outwardly from the high-dielectric-constant layer; and the inner electrode and the outer electrode separated by the high-dielectric-constant layer.

8. The device of claim 7, wherein the high-dielectric-constant layer comprises a material selected from the group consisting of barium strontium titanate $(Ba,Sr,Ca,Pb)(Ti,Zr)O_3$, $(Pb,La)(Zr,Ti)O_3$, bismuth titanate, potassium tantalate, lead scandium tantalate, lead niobate, potassium niobate, lead zinc niobate, lead magnesium niobate, tantalum pentoxide, and yttrium oxide.

9. The device of claim 7, wherein the outer electrode comprises a material selected from the group consisting of platinum, palladium, ruthenium, rhodium, gold, iridium, silver, titanium nitride, ruthenium nitride, tin nitride, zirconium nitride, tungsten nitride, ruthenium dioxide, tin oxide, zinc oxide, doped zinc oxide, iridium oxide, titanium silicide, tantalum silicide, tungsten silicide, molybdenum silicide, nickel silicide, tantalum carbide, titanium boride, tantalum titanium molybdenum, tungsten, aluminum, doped silicon, and doped germanium.

10. A semiconductor device formed outwardly from an outer surface of a semiconductor substrate, comprising:

an active region disposed proximate the outer surface of the substrate;

a conductive plug electrically connected to the active region;

an interlevel isolation layer disposed adjacent the outer surface of the semiconductor substrate and surrounding the conductive plug;

an inner electrode electrically coupled to the conductive plug and disposed proximate portions of an outer surface of the interlevel isolation layer;

an adhesion layer overlying the conductive plug and disposed between the interlevel isolation layer and the inner electrode, the adhesion layer comprising at least partially oxidized titanium and having a thickness in the range of 2 to 100 angstroms, the adhesion layer causing adhesion between the material comprising the interlevel isolation layer and the material comprising the inner electrode;

a barrier layer disposed between the adhesion layer and the inner electrode, the barrier layer operating to separate the material contained in the inner electrode from the material contained in the conductive plug; and a sidewall isolation ting surrounding the barrier layer and separating the edges of the barrier layer from the inner electrode.

11. The device of claim 10, wherein the sidewall isolation ring comprises:

a material selected from the group consisting of silicon dioxide and silicon nitride.

12. The device of claim 10, wherein the interlevel isolation layer comprises a material selected from the group consisting of silicon dioxide, silicon nitride, boron phosphate silicate glass, and spin-on glass.

13. The device of claim 10, and further comprising:

a high-dielectric-constant layer disposed outwardly from the inner electrode;

an outer electrode disposed outwardly from the high-dielectric-constant layer; and the inner electrode and the outer electrode separated by the high-dielectric-constant layer.

14. The device of claim 13, wherein the high-dielectric-constant layer comprises a material selected from the group consisting of barium strontium titanate, $(Ba,Sr,Ca,Pb)(Ti,Zr)O_3$, $(Pb,La)(Zr,Ti)O_3$, bismuth titanate, potassium tantalate, lead scandium tantalate, lead niobate, potassium niobate, lead zinc niobate, lead magnesium niobate, tantalum pentoxide, and yttrium oxide.

15. The device of claim 13, wherein the outer electrode comprises a material selected from the group consisting of platinum, palladium, ruthenium, rhodium, gold, iridium, silver, titanium nitride, ruthenium nitride, tin nitride, zirconium nitride, tungsten nitride, ruthenium dioxide, tin oxide, zinc oxide, doped zinc oxide, iridium oxide, titanium silicide, tantalum silicide, tungsten silicide, molybdenum silicide, nickel silicide, tantalum carbide, titanium boride, tantalum titanium molybdenum, tungsten, aluminum, doped silicon, and doped germanium.

16. The electronic device of claim 10, wherein the sidewall isolation ring comprises:

a material selected from the group consisting of silicon dioxide and silicon nitride.

17. The device of claim 1, wherein the adhesion layer forms a blanket coating over the conductive plug and the interlevel isolation layer.

18. The device of claim 1, wherein the adhesion layer comprises titanium dioxide.

19. The device of claim 18, wherein the adhesion layer forms a blanket coating over the conductive plug and the interlevel isolation layer.

20. A semiconductor device formed outwardly from an outer surface of a semiconductor substrate, comprising:

an active region disposed proximate the outer surface of the substrate;

a conductive plug electrically connected to the active region;

an interlevel isolation layer disposed adjacent the outer surface of the semiconductor substrate and surrounding the conductive plug;

an inner electrode electrically coupled to the conductive plug and disposed proximate portions of an outer surface of the interlevel isolation layer; and an adhesion layer overlying the conductive plug and disposed between the interlevel isolation layer and the inner electrode, the adhesion layer having a thickness in the range of 5 to 10 angstroms, the adhesion layer operating to cause adhesion between the material comprising the interlevel isolation layer and the material comprising the inner electrode.

* * * * *